United States Patent [19]

Fenk

[11] Patent Number: 4,479,259
[45] Date of Patent: Oct. 23, 1984

[54] TRANSISTOR OSCILLATOR CIRCUIT

[75] Inventor: Josef Fenk, Eching/Ottenburg, Fed. Rep. of Germany

[73] Assignee: Siemens Aktiengesellschaft, Berlin and Munich, Fed. Rep. of Germany

[21] Appl. No.: 313,629

[22] Filed: Oct. 21, 1981

[30] Foreign Application Priority Data

Nov. 3, 1980 [DE] Fed. Rep. of Germany ....... 3041392
Dec. 5, 1980 [DE] Fed. Rep. of Germany ....... 3045993

[51] Int. Cl.³ .......................... H04B 1/26; H03B 5/12
[52] U.S. Cl. ................................... 455/318; 331/109; 455/333
[58] Field of Search ...................... 455/318, 319, 333; 331/108 R, 109, 116 R, 117 R, 183

[56] References Cited

U.S. PATENT DOCUMENTS 3,325,747  6/1967  Schrecongost ..................... 331/117
3,775,702 11/1973  Wallace .............................. 331/109
4,058,771 11/1977  Ohsawa et al. .................... 455/318
4,268,916  5/1981  Kusakabe ........................... 455/333

OTHER PUBLICATIONS

Ing. Günther Pletz, German Publication "Funkschau" (1971), No. 15, pp. 465 and 466.

Primary Examiner—Marc E. Bookbinder
Attorney, Agent, or Firm—Herbert L. Lerner; Laurence A. Greenberg

[57] ABSTRACT

Transistor oscillator circuit having a resonant-circuit or crystal-controlled oscillator realized by a feedback differential amplifier and provided for driving a mixture stage including a pair of transistors forming the oscillator and having a current-carrying output connected to a respective input of the mixture stage, the latter being of symmetrical construction, a low pass filter also connected to the current carrying output of the oscillator, a common control amplifier having an output, and respective inputs connected to the oscillator via the low pass filter, and means for feeding back the output of the control amplifier to the oscillator in the sense of negative feedback.

11 Claims, 4 Drawing Figures

TRANSISTOR OSCILLATOR CIRCUIT

The invention relates to a transistor oscillator circuit in which the resonant-circuit or crystal-controlled oscillator is realized by a feedback differential amplifier and is provided for driving a mixer stage.

Such circuits can be used, for example, in radio and in television engineering, respectively. Details regarding the construction of oscillators based on a differential amplifier in bipolar technology are known, for example, from the German publication "Funkschau" (1971), No. 15, Pages 465 and 466. Such oscillators are suitable for operation with parallel as well with serially formed tuned circuits, and, in spite of the simple construction thereof, operate properly even for greatly different resonance resistances without any occurrence of relaxation oscillations. In addition, the amplitude at the resonant circuit is stabilized and the circuit is combinable largely monolithically. If, however, the oscillator is used for driving a mixer stage, particularly in an integrated oscillator-tuner-mixer circuit, the optimum with respect to suppression of the effect of the input signal or oscillator signal on the output of the mixing stage and thereby on the reproduction quality of a radio or television receiver using such a circuit is, by far, unachieved if conventional circuits are applied. Also, with respect to the suppression of oscillator noise, the heretofore known circuits of this general type need improvement.

It is accordingly an object of the invention of the instant application to provide a transistor oscillator circuit which avoids the aforementioned disadvantages of the heretofore known circuits of this general type.

With the foregoing and other objects in view, there is provided, in accordance with the invention a transistor oscillator circuit having a resonant-circuit or crystal-controlled oscillator realized by a feedback differential amplifier and provided for driving a mixture stage comprising a pair of transistors forming the oscillator and having a current-carrying output connected to a respective input of the mixture stage, the latter being of symmetrical construction, a low pass filter also connected to the current carrying output of the oscillator, a common control amplifier having an output, and respective inputs connected to the oscillator via the low pass filter, and means for feeding back the output of the control amplifier to the oscillator in the sense of negative feedback.

In accordance with an added feature of the invention, the individual components thereof are constructed in bipolar technology.

In accordance with another feature of the invention, the individual components are in monolithically integrable form.

In accordance with a further feature of the invention, the pair of transistors forming the oscillator are connected by the emitters thereof to reference potential of the circuit via a common resistor, and by the base leads thereof, via a voltage divider, to a pole of a d-c voltage source, the other pole of which is connected to reference potential, the base leads of the pair of transistors being connected to a respective end point of the voltage divider, and the d-c voltage source to a divider point of the voltage divider, the collectors of the pair of resistors being connected, via a load resistor, respectively to a first supply potential of the circuit formed as another d-c voltage source, and including a frequency-determining control of the oscillator comprising a control member and two capacitors, one of the capacitors being connected to the base of one of the pair of transistors and the other of the capacitors being connected to the collector of the other of the pair of transistors, the control capacitors having respective leads facing away from the oscillator and connected to one another by at least part of the control member.

In accordance with an additional feature of the invention, the pair of transistors forming the oscillator are connected by the emitters thereof to reference potential of the circuit via a common resistor, and by the base leads thereof, via a voltage divider, to a pole of a d-c voltage source, the other pole of which is connected to reference potential, the base leads of the pair of transistors being connected to a respective end point of the voltage divider, and the d-c voltage source to a divider of the voltage divider, the collectors of the pair of resistors being connected, via a load resistor, respectively to a first supply potential of the circuit formed as another d-c voltage source, and including a frequency-determining control of the oscillator comprising a control member and two capacitors, one of the capacitors being connected to the base of one of the pair of transistors and the other of the capacitors being connected to the collector of the other of the pair of transistors, the control capacitors having respective leads facing away from the oscillator, the control member being a parallel resonant circuit, the control-capacitor leads facing away from the oscillator being connected directly to one another and being driven by the parallel resonant circuit.

In accordance with an added feature of the invention, the collectors of the pair of transistors form the outputs of the oscillators and are connected via respective resistors to operating potential of the circuit and further connected via other respective resistors and a capacitor serially connected therewith to respective inputs of a control amplifier, the control amplifier having an output connected to the base of one of the pair of transistors and via a capacitor, to reference potential of the circuit.

In accordance with yet another feature of the invention, the symmetrical mixture stage has two oscillator inputs, and the pair of transistors of the oscillator have collectors directly connected, respectively, to the oscillator inputs for directly controlling the same.

In accordance with yet an added feature of the invention, the symmetrical mixture stage comprises a first pair of identical transistors, and including a pair of terminals for a signal to be processed, respectively, connected to the bases of the first pair of identical transistors and additionally connected, via a respective resistor, to one pole of a first d-c voltage source having another pole connected to reference potential of the circuit, the first pair of identical transistors having respective emitters connected via a common resistor to reference potential of the circuit, second and third pairs of transistors, the first pair of transistors having respective collectors connected to both of the emitters of each of the respective second and third pairs of transistors, respectively, each of the transistors of the second pair of transistors being connected, via the base thereof, with the base of a respective transistor of the third pair of transistors and, via a collector thereof, with the collector of a respective transistor of the third pair of transistors, the collector terminals of the second and third pair of transistors being also connected to respective emitters of a fourth pair of transistors having respective collectors forming terminals for the signal output of the mixer stage, the fourth pair of transistors having respective base terminals connected via a common resistor to one pole of a second d-c voltage source having another pole connected to reference potential of the circuit, the current-carrying output of the pair of transistors forming the oscillator being formed by the respective collectors of the last-mentioned pair of transistors and being controllingly connected to respective terminals of the respective connected pairs of bases of the second and third pairs of transistors.

In accordance with yet a further feature of the invention, the one pole of the second d-c voltage source is connected to the collectors of a fifth pair of transistors having emitters, operated in an emitter-follower circuit and operatively connected respectively, to a pair of control terminals of the mixture stage realized by respective base terminals of the respective connected pairs of bases of the second and third pairs of transistors.

In accordance with yet a further feature of the invention, the current-carrying output of the pair of transistors forming the oscillator is formed by the respective collectors of the pair of transistors for carrying signals controlling emitter potential for the pair of transistors, with an amplifier further interposed for amplitude control.

In accordance with yet an additional feature of the invention, there is provided a transistor oscillator circuit having a resonant-circuit of crystal-controlled oscillator realized by a feedback differential amplifier comprising a pair of transistors, and a frequency-determining control member having a control capacitor connected via a first coupling capacitor to the base of a first one of the transistors of the differential amplifier, the first transistor having an emitter connected, on one hand, to the emitter of the second transistor of the differential amplifier and, on the other hand, to a supply terminal of the oscillator circuit carrying reference potential, the first and second transistors of the differential amplifier having respective collectors forming respective output terminals of the oscillator circuit and being connected, respectively, via a respective load resistor, to a supply terminal carrying a first operating potential, the second transistor of the differential amplifier having a base connected, via another capacitor, to a supply terminal carrying reference potential and, via two resistors in series, to the base of the first transistor of the differential amplifier as well as via a circuit point between the last-mentioned two resistors and via a second d-c voltage source, to a supply terminal carrying reference potential, the control capacitor of the frequency-determining control member having connected thereto the collector of the second transistor of the differential amplifier via a second coupling capacitor, comprising a first and a second lead extending from the control capacitor of the frequency-determining control member, the latter being connected by the first lead to the first coupling capacitor leading to the first transistor of the differential amplifier and by the second lead to the second coupling capacitor leading to the collector of the second transistor of the differential amplifier, the frequency-determining control member having another control capacitor with one lead thereof directly connected to a lead of the second coupling capacitor facing away from the second transistor of the differential amplifier, the one lead of the other control capacitor being also connected, via a resistor, to one pole of a third d-c voltage source, the other control capacitor having another lead which, as well as the other pole of the third d-c voltage source, is directly connected to the supply terminal of the oscillator circuit carrying reference potential.

In accordance with an alternate feature of the invention the first and the second transistors of the differential amplifier comprise respective bipolar npn transistors monolithically integrated.

In accordance with still a further feature of the invention, at least one of the two control capacitors of the frequency determining control member is realized by a semiconductor capacity diode or varactor.

In accordance with still another feature of the invention, the first coupling capacitor is formed by a fixed capacitor and a tunable capacitor in series, the fixed capacitor being connected directly to the base of the first transistor of the differential amplifier, and the tunable capacitor being connected directly to the first-mentioned control capacitor of the frequency-determining control member.

In accordance with still a further feature of the invention, the two coupling capacitors of the frequency-determining control member of the oscillator are connected in a series circuit shunted by an inductance, the frequency-determining control member comprising a parallel resonance tuned circuit.

In accordance with still an additional feature of the invention, the one and the other control capacitors of the frequency-determining control member of the oscillator are connected in a series circuit, in turn, connected in series with a resonant circuit or an oscillating crystal, as well as with the second coupling capacitor, so that the resonant circuit inductance or the capacitance of the oscillating crystal is connected between the second coupling capacitor and the one control capacitor.

In accordance with still an added feature of the invention, the second coupling capacitor is an oscillating crystal capacitor.

Other features which are considered as characteristic for the invention are set forth in the appended claims.

Although the invention is illustrated and described herein as embodied in a transistor oscillator circuit, it is nevertheless not intended to be limited to the details shown, since various modifications and structural changes may be made therein without departing from the spirit of the invention and within the scope and range of equivalents of the claims.

BRIEF DESCRIPTION OF THE FIGURES

The construction and method of operation of the invention, however, together with additional objects and advantages thereof will be best understood from the following description of specific embodiments when read in connection with the accompanying drawings, in which.

DETAILED DESCRIPTION OF THE INVENTION

The embodiment according to the invention may be realized by means of bipolar transistors. It should be mentioned, however, in this connection that the oscillator as well as the mixer stage and the circuit parts to be used for negative feedback to the oscillator may also be realized with MOS technology.

Figure 1:
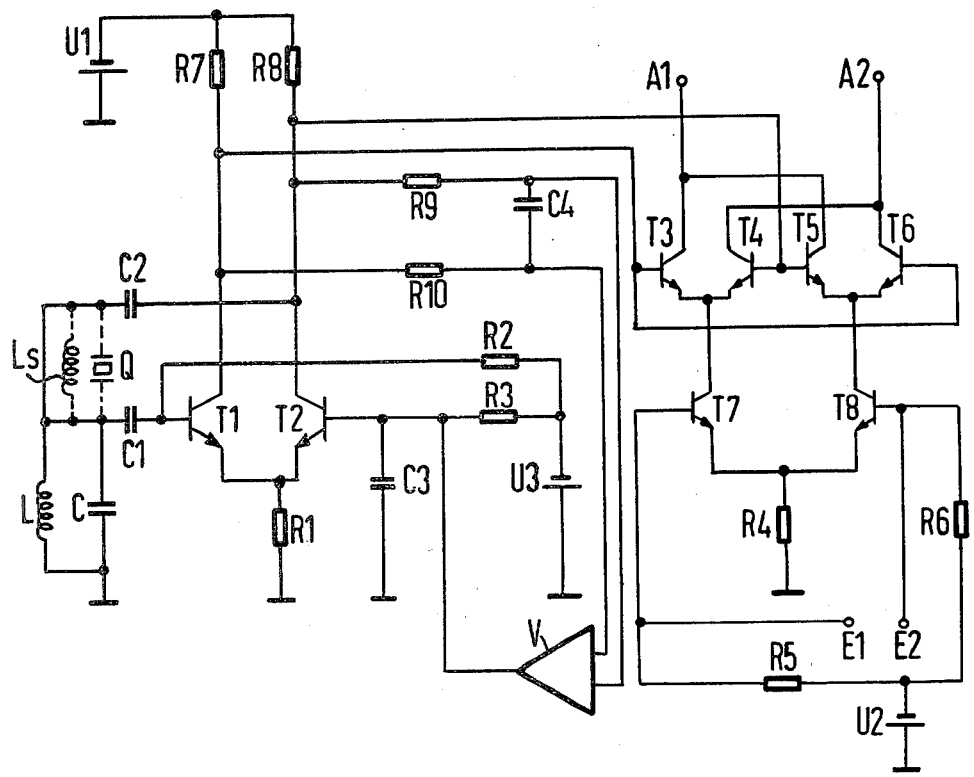
FIG. 1 is a circuit diagram of the transistor oscillator circuit according to the invention showing the general principles thereof.

Referring now specifically to the drawings and, first, especially to FIG. 1 thereof, there are shown two identical bipolar transistors T1 and T2 of npn type forming the oscillator in the circuit. They are tied together by the emitters thereof and are connected via a resistor R1 to a second operating potential serving as reference potential (ground) and which is made available by a d-c voltage source U1. The other pole of the d-c voltage source U1, which supplies a first operating potential, is connected via a resistor R7 and R8, respectively, to the collector of the respective transistors T1 and T2, of the oscillator. The base of the transistor T1 forms the control input of the oscillator because it is connected via a capacitor C1 to the frequency-determining control member of the oscillator. This control member is either a parallel-resonance circuit i.e. a resonant circuit formed by a capacitor C with an inductance L shunted thereto, which is connected on the one side to the reference potential and on the other side, via the capacitor C1, to the control input T1 of the oscillator and as well, via a further (identical) capacitor C2, to the collector of the other transistor T2 of the oscillator.

As an alternative thereto, the resonant circuit may be a series circuit. Then the inductance L is omitted at this point and the resonant-circuit capacitor C is replaced by the inductance Ls which exclusively connects the two poles, respectively, of the coupling capacitors C1 and C2 facing away from the oscillator. In the case of a crystal control, the crystal oscillator Q replaces the series inductance Ls. The parallel inductance L and the parallel capacitor C are likewise omitted in this case.

The base of the transistor T1 is connected to the base of the transistor T2 via two series-connected resistors R2 and R3. The divider point between these two resistors R2 and R3 is connected to ground via a d-c voltage source U3. A further capacitor C3 is provided between the base terminal of the second transistor T2 and reference potential. Due to the feedback effecting the oscillator action of the differential amplifier T1, T2 between the base terminal of the transistor T1 and the collector terminal of the transistor T2, the collectors of the two transistors T1 and T2 are able to supply the following mixer stage with the sine oscillations required for operating the circuit.

The mixer stage is formed of two transistor pairs T3, T4 and T5, T6 which, like the transistors of the oscillator T1, T2, are formed of transistors of the npn type. The symmetrical mixer stage is realized due to the connection of the transistors T3 and T4, on the one hand, and the transistors T5 and T6, on the other hand, together in pairs via the emitters thereof, and the connection of the collector of a respective transistor of the two pairs to the one output terminal A1 and the collector of a respective one of the two other transistors of both pairs to the other output terminal A2. In the case of the illustrated embodiment of FIG. 1, the collector of the transistor T3 and the collector of the transistor T5 are connected to the terminal A1; the collector of the transistor T4 and the collector of the transistor T6 are connected to the terminal A2 of the output of the mixer stage.

On the other hand, the transistors T3 and T4 are tied together on the one side and the transistors T5 and T6 on the other side, via the emitters thereof, to form a respective pair and each of the two pairs T3, T4 and T5, T6 are connected via emitters thereof to the collector of a respective additional npn transistor T7 and T8. These transistors T7 and T8 are, in turn, again tied together via the emitters thereof and connected via the emitters thereof through a common resistor R4 to the common reference potential of the circuit. The transistors T3 and T6 form a first common input terminal via the base terminals thereof, and the transistors T4 and T5, via the base terminals thereof, a second common input terminal for the oscillator signal supplied by the oscillator output. Therefore, the base terminals of the transistors T3 and T6 are connected to the collector of the transistor T1, and the base terminals of the transistors T4 and T5 of the mixer stage are connected to the collector of the other transistor T2 of the oscillator.

The npn transistors T7 and T8 which are provided for driving the emitters of the first transistor pair T3, T4, on the one hand, and of the second transistor pair T5, T6 on the other hand of the mixer stage, serve in turn as the signal input of the mixer stage and, therefore, of the circuit. They are consequently controlled in operation by an external signal which is supplied, for example, by an input amplifier (not shown). To this end, the base of the transistor T7 is connected to the one input terminal E1, and the base of the other transistor T8 is connected to the other input terminal E2. Finally, the two transistors T7 and T8 supply the emitter potential which is necessary for the transistor pairs T3, T4 and T5, T6 of the mixer stage. To this end, a further d-c voltage source U2 is provided, one pole of which is tied to the common reference potential, while the other pole is connected, on the one hand, via a resistor R5 to the base of the transistor T7 and via a resistor R6, on the other hand, to the base of the transistor T8.

It is important for the invention that each of the two outputs of the oscillator i.e. the collectors of the two transistors T1 and T2, be connected via a resistor R9 and R10, respectively, to a respective input of a control amplifier V i.e. a differential amplifier, and that, furthermore, the terminal of the resistor R9 and R10, respectively, facing away from the transistors T1 and T2, respectively, be connected via a capacitor C4. The resistor R9 and the resistor R10, together with the capacitor C4, thereby form a low-pass filter which serves for controlling a respective one of the two inputs of the control amplifier.

The signal output of the control amplifier V is connected directly to the base of the transistor T2 which is not directly connected to the capacitor C1 and, therefore, via the latter to the frequency-determing control member of the oscillator.

The low-pass filter R9 and R10, C4 is so constructed that the appearance of the oscillator oscillation at the input of the control amplifier V is completely suppressed. This requires that the negative feedback which is effected by the described circuit, is purely d-c-wise. A result thereof is that the basically unavoidable asymmetry of the potential changes at the two output terminals of the oscillator and, therefore, at the two inputs T3, T6 and T4, T5 is reduced. This has the effect of suppressing the oscillator noise as well as compensating other disturbances stemming from the oscillator on the intermediate frequency signal supplied from the output of the mixer stage A1, A2, so that the provided negative feedback at the oscillator clearly means a substantial improvement as compared to circuits which do not use a measure corresponding to the invention.

The control amplifier V is advantageously designed as an operational amplifier.

Figure 2:
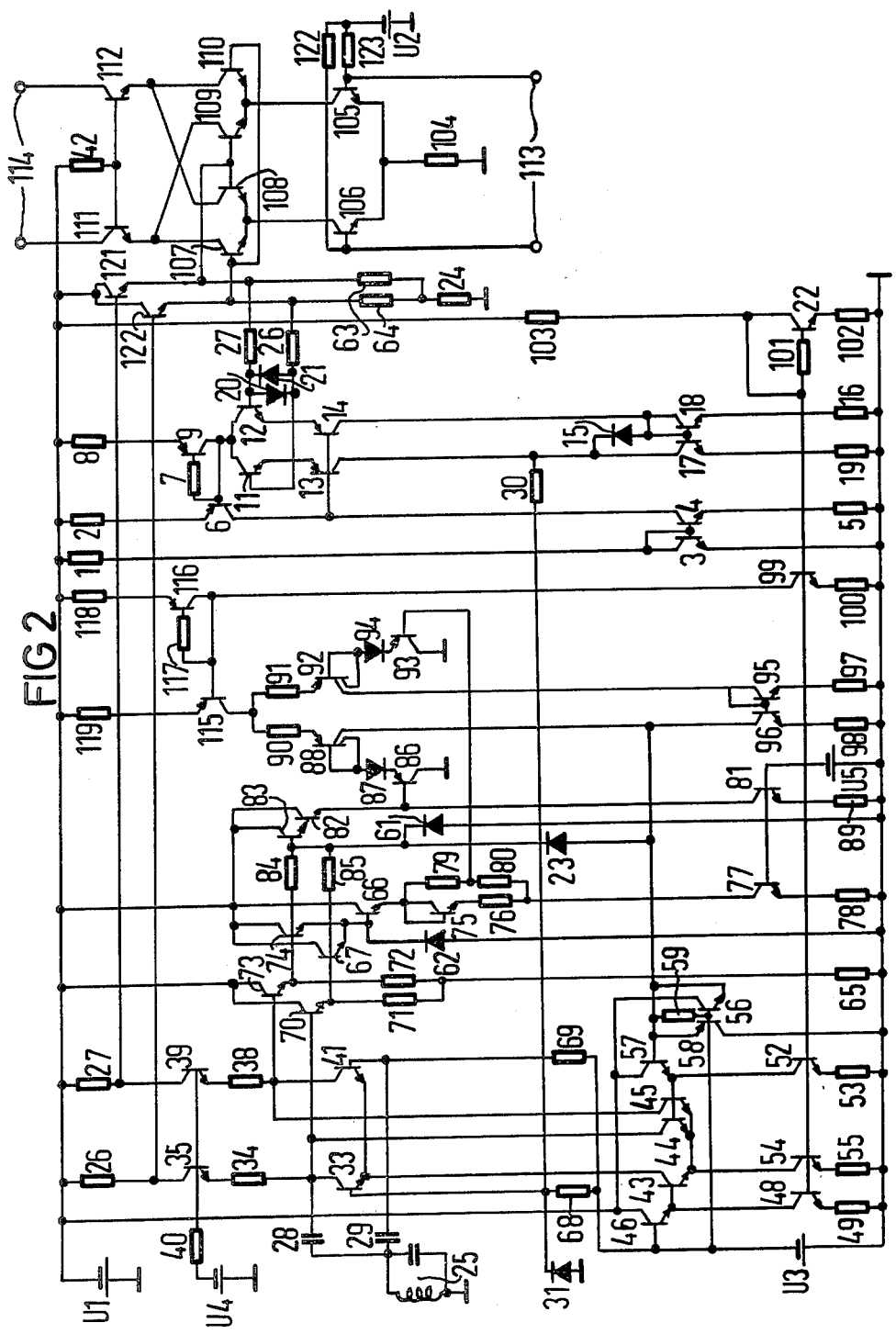
FIG. 2 is a circuit diagram of a more detailed embodiment of the circuit of FIG. 1.

The circuit of an oscillator-mixer combination in bipolar technology shown in FIG. 2 contains in principle the same circuit parts as are given in the circuit diagram according to FIG. 1. However, the circuit is considerably more detailed. It is formed mainly of npn transistors in addition to several pnp transistors, as well as of diodes, capacitors and resistors so that, except for the resonant circuit, the rest of the circuit can be combined monolithically without difficulty. In addition to the circuit parts shown in FIG. 1, constant-current sources are provided which, among other things, serve for improving the desired effect as well as the operation of the oscillator and the mixer stage.

The resonant circuit which is constructed, in the embodiment shown in FIG. 2, as a parallel-resonance circuit and serves for determining the oscillator frequency, is connected via two coupling capacitors 28 and 29 to the control input of the oscillator. The oscillator is realized again by two npn transistors 33, 41 which correspond to the transistors T1 and T2 according to FIG. 1 and are mutually connected by the emitters thereof. A resonant circuit 25 connected by another terminal thereof to reference potential (ground) is connected by a first terminal thereof, via a capacitor 28, to the collector of the transistor 33, and via a capacitor 29, to the base of the transistor 41. The latter is further connected via a voltage divider formed of the two resistors 68, 69 to the base of the transistor 33 of the oscillator. The divider point of this voltage divider 68, 69 is connected to the cathode of a diode 31, having an anode which is connected to reference potential i.e. ground. In addition, the cathode of the diode 31 is connected to the base of the transistor 33 and, on the other hand, via a resistor 30, to the output of a circuit part which is yet to be described and serves as current source, while the anode of the diode 31 is tied to reference potential.

The collector of the oscillator transistor 33 as well as the collector of the oscillator transistor 41 is connected via a respective resistor 34 and 38 to the emitter of a respective transistor 35 and 39 of the npn type, the collectors of which are connected via a respective resistor 36 and 37 to the first supply potential supplied by a d-c voltage source U1. The first supply potential is supplied by the positive terminal and the reference potential by the negative terminal of the d-c voltage source U1. For generating the potential of the base terminals of the two transistors 35 and 39 serving for the signal decoupling of the oscillator signal, they are connected via a resistor 40 to the positive pole of a further d-c voltage source U4 which is referred with the negative pole thereof likewise to ground. The two cascode transistors 35 and 39 form with the collectors thereof the two output terminals of the oscillators.

In order to connect the oscillator also to reference potential, the emitters of the two oscillator transistors 33 and 41 are connected to the collector of an npn transistor 43, the emitter of which is combined with the emitter of two further transistors 44 and 45 (likewise of the npn type) likewise serving as a current source, and, via the collector-emitter path of a further npn transistor 54 and the resistor 55 to reference potential. In this connection, the collector of the current supply transistor 44 is connected to the collector of the oscillator transistor 33, and the collector of the transistor 45 is connected to the collector of the oscillator transistor 41. The circuit means serving for generating the base potentials of the transistors 43, 44 and 45 will be discussed further hereinbelow.

The output terminals of the oscillator i.e. the collectors of the npn transistors 35 and 39 are provided both for the negative feedback effected according to the invention, as well as for driving the mixing stage. For this purpose, the collector of the transistor 35 is connected to the base of an npn transistor 120, and the collector of the transistor 39 to the base of an npn transistor 121. The collectors of these two transistors 120 and 121 are connected to the first supply potential i.e. to the positive pole of the voltage source U1, and the emitter electrodes thereof are connected via a respective (identical) resistor 64 and 63 which are, in turn, connected to each other and are connected via a further resistor 25 to the reference potential of the circuit. The emitters of the two npn transistors 120 and 121, which serve as emitter followers for the mixer stage, are connected to the inputs of the symmetrical mixer stage provided for driving by the oscillator.

The mixer stage is formed of the npn transistors 107, 108, 109, 110, 111, 112, and 106 and 105, as well as the resistors 104, 122 and 123. The transistors 107 and 108 form the first transistor pair and the transistors 109 and 110 the second transistor pair corresponding to the circuit shown in FIG. 1 for the symmetrical mixer stage. The tie-in of the transistors 107 and 108 or 109 and 110 is again provided by the connection of the emitters of the transistors of the respective transistor pair as well as the drive thereof by the collector of a respective npn transistor 106 and 105 assigned to the respective pair. Like the transistors T7 and T8 in FIG. 1, the transistors 105 and 106 which can be controlled via the base terminals thereof and via the signal input 113 externally by the signal to be processed, are furthermore provided via another d-c voltage source U2, and via a resistor 122 and 123, respectively, with the required base voltage, while the emitters of these two transistors 105 and 106 are connected to reference potential via a common resistor 104. The transistor 107 of the first and the transistor 110 of the second transistor pair of the mixer stage is controlled via the emitter of the transistor 120, operated as an emitter follower, by the oscillator signal. On the other hand, the transistor 108 of the first and the transistor 109 of the second pair of the mixer stage are controlled by the emitter of the transistor 121. The emitter of the transistor 121 is furthermore connected via a resistor 27 to the base of a transistor 12 connected in a circuit including transistors 11 and 12 to be described further hereinafter.

The collectors of the transistor 107 and the transistor 109 of the mixer stage control, in common, the emitter of the output transistor 111 (of the npn type) and, on the other hand, the collectors of the two transistors 108 and 110 of the mixer stage control, in common, the emitter of the second output transistor 112 (likewise of the npn type) of the mixer stage. The collectors of the two output transistors form the signal output 114 of the circuit. The base terminals of the two output transistors 111 and 112 are connected, in common, via the resistor 42 to the reference potential of the circuit.

In order to obtain the negative feedback provided in accordance with the invention, the collector of the oscillator transistor 33 is connected to the base of an npn transistor 70, and the collector of the oscillator transistor 41 is connected to the base of an npn transistor 73. The two last-mentioned transistors 70 and 73 are operated as emitter followers and are therefore connected by the collectors thereof to the first supply potential supplied by the voltage source U1, while the emitters thereof are connected, via a respective resistor 71 and 72 (of identical design) and a third common resistor 64, to the reference potential of the circuit. In addition, the emitters of these two npn transistors 70 and 73 serve for controlling two transistor combinations. To this end, the emitter of the transistor 70, on the one hand, is connected to the base of an npn transistor 67 and, via a resistor 85, to the base of a further npn transistor 83, while the emitter of the transistor 73 is tied to the base of an npn transistor 74 and, via a resistor 84, to the base of the previously mentioned transistor 83.

The npn transistor 83 is combined with a further npn transistor 82 to form a Darlington stage by directly connecting the emitter thereof to the base of the transistor 82, and the collector thereof to the collector of the transistor 82. The collectors of the transistors 82, 83, 74 and 67 are connected to the first supply potential i.e. to the positive pole of the voltage source U1. The emitters of the npn transistor 67 and 74 are likewise connected to one another and are tied to the cathode of the diode 62 (which forms a capacitor), the anode of which is connected to reference potential. The emitter of the transistor 82 i.e. the input of the Darlington circuit, is connected to the base of the pnp transistor 86, the collector of which is connected to reference potential and the emitter of which is connected to the cathode of a diode 87 which is connected by the anode thereof to the base of a two-collector pnp transistor 88. The one collector of this transistor 88 is directly connected to the base of this transistor 88, the other collector of which is connected to reference potential via the collector-emitter path of an npn transistor 96 and a resistor 98 connected to the emitter of this transistor 96.

The emitter of the aforementioned two-collector transistor 88 is connected, on the one hand, via a resistor 90, to the collector of a further pnp transistor 115 as well as, via a further resistor 91 equal to the resistor 90, to the emitter of a second pnp two-collector transistor 92. The connection of the two collectors and the base of the transistor 92 corresponds to the situation with the two-collector transistor 88. Accordingly, the one collector and the base are directly connected to one another and to the anode of a diode 94, the cathode of which is connected to the emitter of the further pnp transistor 93. The collector of the last-mentioned pnp transistor 93 is tied to reference potential. The second collector of the pnp transistor 92 is connected, via the collector-emitter path of an npn transistor 95 corresponding to the transistor 96 and via a resistor 97 which is equal to the resistor 98, to reference potential. Both npn transistors 95 and 96 form a base-coupled current source.

The pnp transistor 115, which was mentioned in the preceding paragraph and is provided for controlling the emitters of the two-collector transistors 88 and 92, is connected by the emitter thereof, via a resistor 119, on the one hand, to a first supply potential supplied by the source U1. The emitter of a pnp transistor 116 is connected via the resistor 118 also to the first supply potential supplied by the d-c voltage source U1. The base of this further pnp transistor 116 is connected via the resistor 117 both to the base of the pnp transistor 115 as well as to its own collector.

The collector of the last-presented pnp transistor 116 and, therewith, the base of the pnp transistor 115 are connected via the collector-emitter path of an npn transistor 99 and a resistor 100 connected to the emitter of this transistor 99, to the reference potential of the circuit.

The just-introduced pnp transistor 99, together with a further npn transistor 22, forms a constant-current source. For this purpose, the collector of the npn transistor 22 is connected via a resistor 103 to the first supply potential provided by the voltage source U1, and by the emitter thereof, via a resistor 102, to reference potential, while the base of the transistor 22 is connected via a resistor 101 both to its own collector as well as to the base of the npn transistor 99. The resistor 103 furthermore serves for controlling, in a manner to be described hereinafter, of the current supply of the oscillator transistors 33 and 41.

The collector of the aforementioned two-collector pnp transistor 88 which is connected to the collector of the npn transistor 96, is furthermore connected to the anode of a diode 23, the cathode of which is connected to the base of the npn transistor 83 which belongs to the aforementioned Darlington stage. In addition, the last-mentioned collector of the two-collector pnp transistor 88 is connected to the base of a pnp transistor 57 as well as, via the resistor 59, to the positive pole of a further d-c voltage source U3, which was mentioned hereinbefore in connection with the control of the oscillator via the voltage divider 68, 69 connecting the base terminals of the transistors 33 and 41.

The pnp transistor 58, controlled by the collectors of the two-collector transistor 88 and the transistor 96, is connected by the collector thereof to reference potential and by the emitter thereof to the base of a first npn transistor 57 as well as to the emitter of a further npn transistor 56. The collectors of these two transistors 56 and 57 are connected to the first supply potential furnished by the d-c voltage source U1. The transistor combination 56, 58 serves for clamping the maximally possible voltage to the base 57. The emitter of the npn transistor 57 is connected to the base of the npn transistors 44 and 45 mentioned hereinbefore in connection with the oscillator transistors 33 and 41.

The emitters of the npn transistors 70 and 73 provided at the input of the negative-feedback branch of the oscillator and previously mentioned, are provided, as mentioned hereinbefore, for controlling three npn transistors 67, 74 and 83. The emitters of the two transistors 67 and 74 are tied together and are connected to the cathode of a diode 62, the anode of which is kept at reference potential. A further diode 61 is connected by the anode thereof likewise to reference potential, and by the cathode thereof to the base of the npn transistor 83 and, accordingly, to the input of the Darlington stage formed of the transistors 82 and 83. The emitters of the two npn transistors 67 and 74 are furthermore connected to the base of an npn transistor 66, the collector of which is connected to the first supply potential (supplied by the voltage source U1) and the emitter of which is connected to the collector and the emitter of a further npn transistor 75 as well as, via a resistor 79, both to the base of the pnp transistor 93 mentioned hereinbefore in connection with the second two-collector transistor 92 as well as, via a further resistor 80, to the collector of a further npn transistor 77. The collector of the last-mentioned npn transistor 77 is, furthermore, connected via a resistor 76 to the emitter of the npn transistor 75 which is connected as a diode.

The emitter of the last-introduced npn transistor 77 is connected to reference potential via a resistor 78. The base of this transistor 77 is connected to the base of the npn transistor 81 which was previously mentioned in connection with the Darlington stage formed of the npn transistors 82, 83, the emitter of the npn transistor 81 leading, via a resistor 89, to reference potential. Both base terminals of the transistors 77 and 81 are supplied via a fifth d-c voltage source U5, the negative pole of which is connected to supply potential. A further constant-current source is formed of the base-coupled npn transistors 3 and 4, the emitter of the transistor 3 being connected directly and the emitter of the transistor 4, via a resistor 5, to the refeference potential of the circuit. The collector of the transistor 3 is connected to its own base and, via a resistor 1, to the first operating potential. The collector of the second transistor 4 of the current source and, accordingly, the output thereof is connected to the collector of a further pnp transistor 6, the emitter of which is connected, via a resistor 2, to the first supply potential and the base of which is connected, via a resistor 7, to the base of a further npn transistor 9. A resistor 8 forms the connection of the emitter of this further npn transistor 9 to the first supply potential. The collector of the pnp transistor 9 is connected to the collector of two further npn transistors 11 and 12.

The base of the first of these npn transistors i.e. the transistor 11, leads, via the resistor 26, to the base terminal of the transistor 107 and the base terminal of the transistor 110 of the mixer stage and therefore to the signal input thereof to be driven by the oscillator. The base of the second one of these npn transistors, namely of the transistor 12, leads via the resistor 27 to the base terminals of the transistors 108 and and 109 and, thereby, likewise to that input of the symmetrical mixer stage which is controlled by the other output of the oscillator.

The base terminals of the aforementioned npn transistors 11 and 12 are shunted, ahead of the resistors 26 and 27, by two diodes furnishing the desired low-pass effect. The base of the transistor 11 is connected to the anode of the diode 21, and the cathode of this diode 21 is connected to the base of the npn transistor 12. In the case of the diode 20, the anode thereof is connected to the base of the npn transistor 12 and the cathode thereof directly to the pole of the base of the transistor 11.

The collector terminals of the npn transistors 11 and 12, as mentioned hereinbefore, are supplied in common from the transistor 9 of the constant-current source containing the transistors 3, 4, 6 and 9.

The signal output of the two npn transistors 11 and 12 is provided by the emitter terminals thereof which, for this purpose, are connected to respective emitters of pnp transistors 13 and 14, respectively. The respective bases of the pnp transistor 13 and the pnp transistor 14 are connected directly to the collector of the aforementioned current supply transistor 4. The collectors of the two last-mentioned pnp transistors 13 and 14 are connected via the collector-emitter path of a respective npn transistor 17 and 18, and a resistor 19 and 16, respectively, connected in series with the emitter of the respective transistors 17 and 18, to the reference potential of the circuit. In addition, the two transistors 17 and 18 are connected directly together by the base terminals thereof, the base of the transistor 18, furthermore being short-circuited to its own collector and thus, this transistor 18 being connected as a diode. Finally, the respective bases of the two npn transistors 17 and 18 are connected to the anode of a diode 15, the cathode of which is connected to the collector of the npn transistor 17 and, thus, to the collector of the pnp transistor 13. In addition, the collectors of the transistors 17 and 13 are connected, via the aforementioned resistor 30, to the base of the oscillator transistor 33 and, therewith, fed back to the oscillator.

The npn transistors 45 and 46, repeatedly mentioned hereinbefore in connection with the two oscillator transistors 33 and 41, receive, like the emitter of the likewise aforementioned npn transistor 43, the supply potential thereof from the collector of an npn transistor 54, the emitter of which is driven, via a resistor 55, by the reference potential. A further npn transistor 52 is connected by the emitter thereof, via the resistor 53, likewise to reference potential, while the collector of the transistor 52 is connected, on the one hand, to the respective base of the npn transistors 44 and 45, respectively, mentioned hereinabove, and to the emitter of a further npn transistor 57. The three npn transistors 48, 52 and 54 are all connected by the base terminals thereof to the collector of the current supply transistor 22 and thus also to the resistor 103 which establishes the connection to the first supply potential (d-c voltage source U1) of the circuit. The npn transistor 46 is likewise connected by the collector thereof to the first supply potential, while the base potential of this transistor 46 is identical with the base potential of the pnp transistor 58 mentioned hereinbefore in connection with the npn transistors 56 and 57, and with the base potential of the npn transistor 56, and is connected to the positive pole of the d-c voltage source U3.

Thereby, the circuit of an oscillator mixer stage according to the invention as shown in FIG. 2 with the exception of the resonant circuit 25 and which is monolithically integratable without difficulty, is fully described.

With respect to the operation, the following can now be said:

The control amplifier in the feedback of the oscillator is provided by the input transistor 86, the diode 87, both two-collector transistors 88 and 92, the diode 94 and the transistor 93 as well as the npn transistors 95 and 96. The input of the feedback is provided, as mentioned hereinabove, by the two transistors 70 and 73.

By the emitter of the two transistors 70 and 73, the signal with a phase opposite to the signal at the emitters of the transistors 70 and 73 is generated, via the two resistors 84 and 85 at the base of the transistors 83, by summation. Residual components are grounded via the diode 61, so that the two resistors 84 and 85 in combination with the diode 61 act as a lowpass. Thus, the reference value at the base of the transistor 83 is obtained. This reference value is passed on, via the emitter of the transistor 83, the base of the transistor 82 and the emitter of the transistor 82, to the input transistor of the control amplifier i.e. the base of the pnp transistor 86.

The signal at the emitters of the transistors 70 and 73, which is opposite in phase thereto, is likewise passed to the base of the transistors 67 and 74. The emitter of these transistors 67 and 74 is blocked capacitively via the diode 62 from ground i.e. reference potential and is supplied as far as the required emitter voltage is concerned, from the base of the transistor 66. Due to the peak rectification of the transistors 67 and 74, an additional d-c voltage potential is then developed at the diode 62 in accordance with the oscillator amplitude. This potential is passed on, via the emitter of the transistor 66, to the short-circuited base-collector path of the transistor 75. The emitter of the transistor 75 is supplied, via the resistor 76, with the required operating current from the collector of the transistor 77.

The emitter of the transistor 66 is connected to the resistor 79. From this resistor 79, the resistor 80 branches off to the collector of the transistor 77 and the resistor 76 to the emitter of the transistor 75. Through the ratio of the resistance values in the dividers 79 and 80, a d-c voltage value is set which is proportional to the voltage change at the emitters of the transistors 67 and 74. The control amplifier thereby obtains its lead or rate action. The lead of the control amplifier is set via the voltage divider 79 and 80 and, thereby, also the oscillator amplitude.

The output transistors 35 and 39 provided in the oscillator serve to ensure that disturbances which stem from the input 113 of the mixer stage and are present at the collector of these output transistors can be made noticeable only heavily attenuated on the oscillator circuit, due to the slight collector-emitter reaction of the transistors 35, 39.

The signal at the base of the transistors 11 and 12 is amplified via the cascode stage 13 and 14 and the current reflector 17, 18. Through the connection of the transistors 13 and 17 and 14 and 18, respectively, as seen in FIG. 2 and described hereinbefore the collectors of the transistors 13 and 17 form a push-pull current output which acts, via the resistor 30 and the load resistor 68, controllingly on the base of the oscillator transistor 33. The diodes 31 and 15 serve to suppress control oscillations. The diodes 20 and 21 short-circuit the opposite-phase signal at the output of the resistors 26 and 27. Only the d-c component and at most yet components of very low frequency are passed thereby to the control amplifier 11, 12.

The control amplifier 86, 87 serves the purpose of controlling the oscillator amplitude via the push-pull current output which is provided by the collectors of the transistors 88 and 96, and more specifically via the base of the transistor 57. The load resistor setting the voltage is realized by the resistor 59. The control amplifier 11, 12 and so forth, on the other hand, has the purpose of reducing the asymmetry at the mixer.

A further aspect of the invention relates mainly to a further improvement of the transistor oscillator circuit described so far. The further aspect of the invention, however, has advantages also if it is applied to a resonant-circuit of quartz-controlled oscillator which is realized by a feedback differential amplifier, even if the oscillator is not provided for driving a mixer stage.

To employ and operate a differential amplifier as the active part of an oscillator, one can proceed in accordance with the paper published in "Funkschau" (1971), No. 15, Pages 465 and 466, entitled "Two-Pole Oscillator Circuits for Parallel and Series Resonance". Such circuits can be used, for example, in radio or television engineering. Generally, such oscillators operate entirely satisfactorily.

If, however, such an oscillator is used for driving a mixer stage, especially in an integrated oscillator tuner mixer circuit, the optimum with respect to suppression of the input signal and the oscillator signal, respectively, to the output of the mixer stage and, therefore, to the reproduction quality of a radio or television receiver using such an oscillator circuit is not attained by far if the customary design methods for such a circuit are applied. Also, with respect to suppressing the so-called oscillator noise, the heretofore known circuits of this type are in need of improvement.

The oscillator circuit described herein up to this point, which corresponds to the definition at the introduction to this specification, was developed for solving these problems. However, such an oscillator circuit is also in need of improvement with a view to reducing the frequency drift as well as increasing the tuning range and increasing the oscillation reliability which, incidentaly, also applies to the heretofore known oscillator circuits based on differential amplifiers.

To solve the problems mentioned hereinbefore, provision is made, in accordance with the further aspect of the invention, that the capacitor in the frequency-determining control member is connected by the one lead thereof to the first coupling capacitor which leads to the first transistor of the differential amplifier, and by the second lead thereof to the second coupling capacitor which leads to the collector of the second transistor of the differential amplifier; that, in this connection, a further capacitor is provided in the frequency determining control member in such a manner that this further capacitor is connected by the one lead thereof to the lead of the second coupling capacitor facing away from the second transistor of the differential amplifier, directly as well as via a resistor, to the one pole of a third d-c voltage source, while the other lead of this further capacitor in the frequency determining control member as well as the other pole of the third d-c voltage source is directly tied to the supply terminal of the oscillator circuit carrying the reference potential.

Figure 3:
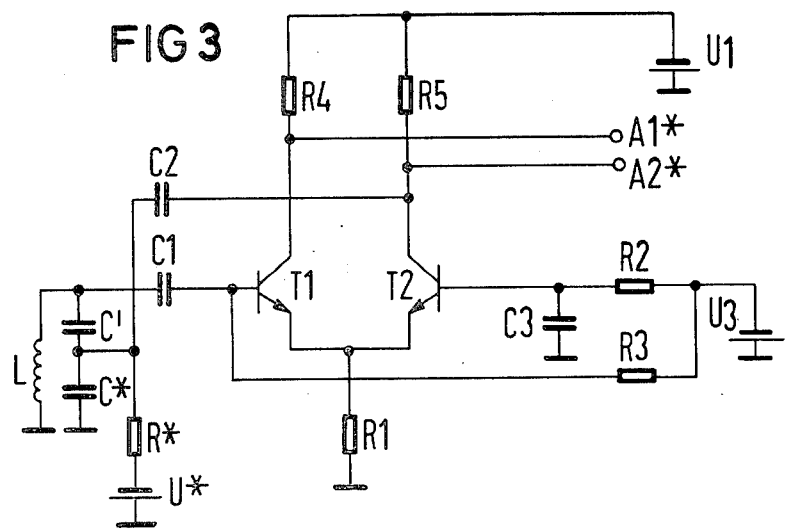
FIG. 3 is a circuit diagram of another generalized embodiment of the invention.
Figure 4:
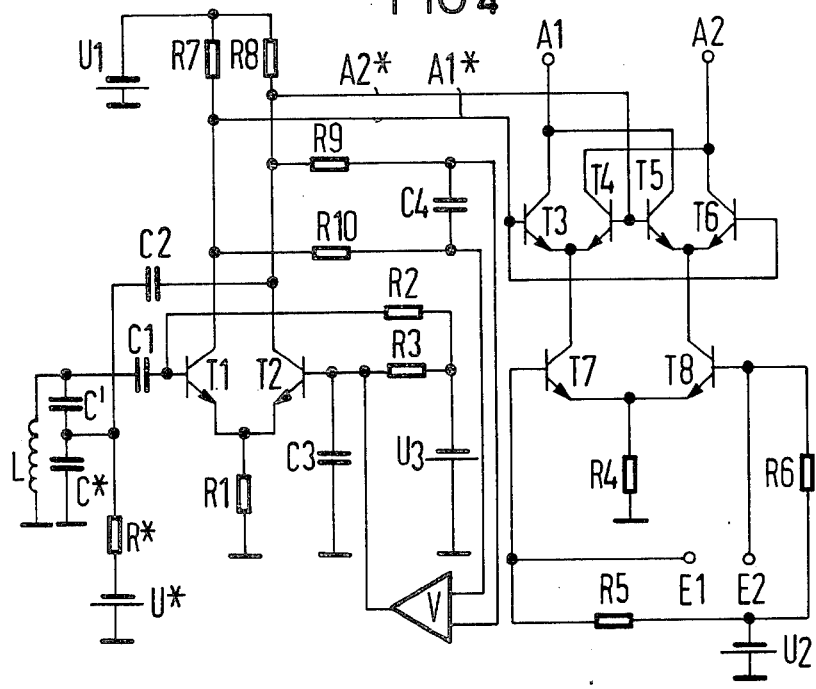
FIG. 4 is a circuit diagram of a more detailed embodiment of the circuit of FIG. 3.

A transistor oscillator circuit improved in this manner is shown in FIG. 3, while the oscillator circuit shown in FIG. 4 corresponds additionally to the transistor oscillator circuit described hereinbefore.

The two bipolar transistors T1 and T2 which form the oscillator in the circuit according to FIGS. 3 and 4, are identical and of the npn type. They are connected together directly by the emitters thereof and these emitters are connected via a common resistor R1 to the supply voltage terminal of the circuit carrying the reference potential i.e. to ground. The supply lead of the oscillator circuit making the first supply potential available is connected to the positive pole and the lead of the oscillator circuit supplying the reference potential is connected to the negative pole of a first d-c voltage source U1.

The base of the first transistor T1 of the differential amplifier forms the control input of the oscillator which is connected to the frequency-determining organ, a first coupling condenser C1 being provided between these two circuit parts. The aforementioned frequency-determining control member is either a parallel-resonance circuit (i.e. a tuned circuit formed of a capacitor with shunted inductance) which is connected, on the one hand, to the supply terminal carrying reference potential and, on the other hand, to a first coupling condenser C1 leading to the base of the first transistor T1 of the differential amplifier.

As an alternative thereto, the aforementioned control member can also be realized by a series-resonant circuit. Then, the inductance L shunted across the tuned-circuit capacitor is replaced in the circuits according to FIGS. 3 and 4 by an inductance which then forms the only connection between the leads of the two coupling capacitors C1 and C2 facing away from the transistors T1 and T2 of the differential amplifier. Finally, an inductance in the control member can be dispensed with completely and, instead, the two terminals of an oscillating-quartz capacitor can be connected to a respective one of the two leads of the first and the second coupling capacitor C1 and C2 not connected to one of the transistors T1 or T2. A particularly advantageous connection of the oscillating-quartz capacity is described hereinafter as a further embodiment of an oscillator according to the invention.

While in the conventional oscillator circuits and also in the oscillator circuit according to FIGS. 1 and 2, only one capacitor C is provided in the frequency-determining control circuit, two capacitors C' and C* connected in series are provided instead in the invention of the instant application and are connected together in a manner yet to be described as well as correspond to the definition of the invention.

The base of the first transistor T1 of the differential amplifier is connected via two series-connected resistors R3 and R2 to the base of the second transistor T2 of the differential amplifier. The divider point between these two resistors R2 and R3 is connected to the positive pole of the second d-c voltage source according to the definition of the invention i.e. the d-c voltage source U3, while the other pole of this d-c voltage source U3 is tied to the supply terminal carrying reference potential i.e. to the negative pole of the d-c voltage source U1. A further capacitor C3 is provided between the base terminal of the second transistor T2 of the differential amplifier and the supply terminal carrying reference potential. Due to the feedback causing the oscillator action of the differential amplifier T1, T2 between the base terminal of the transistor T1 and the collector terminal of the transistor T2, the collectors of these two oscillator transistors T1 and T2 are able to deliver together an undamped sine oscillation. They accordingly form the two output terminals A1* and A2* of the oscillator as per FIG. 1. In the case of the circuit according to FIG. 2, these two output terminals A1* and A2* are connected to two input transistors T3 and T6 of the mixer stage to be driven.

As already explained hereinbefore, two capacitors C' and C* connected in series are provided in the control circuit of a transistor oscillator corresponding to a further embodiment of the invention instead of the single tuned-circuit capacitor C as in the case of the first embodiment of the invention shown in FIGS. 1 and 2. These two capacitors C' and C* together form a capacitive voltage divider.

For the case wherein a parallel resonance circuit is provided as the frequency-determining control member of the oscillator, the tuned-circuit inductance L forms a connection between the two end terminals of the voltage divider C', C*, which shunts or bridges the two capacitors together with the divider point therebetween and, in addition, is connected by one of the leads thereof to the supply terminal carrying reference potential. In the case wherein a series-resonance circuit is used as the frequency-determining control member, this inductance L is omitted. Instead, an inductance shunting the two coupling capacitors C1 and C2 is provided. If the oscillator is to be controlled instead by an oscillating crystal, then the capacitor containing the oscillating crystal Q as the dielectric takes the place of an inductance which must be used in the case of a series-resonance circuit. In all cases, however, the voltage divider formed of the two capacitors C' and C* is provided, the connection of this voltage divider to the two coupling capacitors C1 and C2, to the reference potential or ground, and to the resistors R* and the d-c voltage source U* always corresponds to that of the embodiments shown in FIGS. 1 and 2. The same applies also if, in the case of a particularly advantageous kind of oscillating crystal control, the second coupling capacitor C2 is realized by an oscillating quartz.

As is apparent from FIGS. 3 and 4, the first capacitor C' of the voltage divider C', C* is connected by the free terminal thereof to the first coupling capacitor C1 and, via the latter, to the base of the first oscillator transistor T1. On the other hand, the second capacitor C* of the capacitive voltage divider C', C* is connected by the free terminal thereof to the supply terminal carrying reference potential, to which also the negative pole of the third d-c voltage source U* is connected. The positive pole of the third d-c voltage source U* is connected via a resistor R*, according to the definition of the invention, on the one hand, to the divider point i.e. to a circuit point between the two capacitors C' and C* of the capacitive voltage divider and, on the other hand, to the terminal of the second coupling capacitor C2 facing away from the transistor T2. Finally, in the case wherein a parallel-resonance tuned circuit is used as frequency-controlling member, the tuned-circuit inductance L is connected to the end terminals of the capacitive voltage divider C', C*.

The oscillator circuits customarily used heretofore, which are constructed using a differential amplifier T1, T2, involve so-called two point oscillators wherein the base of the one transistor T1 is connected galvanically i.e. metallically, or capacitively to the collector of the second transistor T2 of the differential amplifier. The middle point of this connection is thus at the high point of a parallel-resonant circuit or at an intermediate point of a series-resonant circuit. The negative slope of the admittance curve of these coupling points ensures that the oscillation remains at the output of the oscillator. However, the reactive components of this slope lead to a disturbing frequency drift as well as to a reduction of the tuning range. The finite gain from the base of the second transistor T2 of the differential amplifier to the output of the amplifier at the collector of the transistor T2, however, is not always sufficient to maintain the oscillating state.

If, in accordance with the teachings of this further embodiment of the invention, a tuned-circuit or oscillating-crystal control circuit controlling the input of such an oscillator, is then equipped with a series capacity C', C* instead of a simple capacitor C and the high point or the middle point of such a tuned-circuit or crystal-controlled circuit, according to the proposals suggested by the invention, is coupled to the oscillator transistors T1 and T2, the parasitic capacitive and real component of the active circuit at the overall tuned-circuit or crystal-controlled circuit is reduced considerably. This increases the range of frequency variation as well as the oscillating reliability, and the tendency toward frequency drift is drastically reduced.

If the oscillator is intended for generating operating frequencies in the television range, the capacitor C' of the capacitive voltage divider C', C* connected to the first coupling capacitor C1, will advantageously be realized in the form of a capacity diode. If necessary or desirable, the other capacitor C* can also be realized by a capacity diode, which is advisable, for example, for the frequency range for cable television or for the ultrashortwave range. By the potential which is provided by the third-d-c voltage source U* and is applied to the resistor R*, the capacity of the two capacitors C' and C* can be influenced particularly if at least one of these two capacitors is realized by a normal pn-junction diode. The influence on the capacities C' and C* has, in turn, an effect which is advantageous with regard to the tuning range for the oscillating frequency. If a particularly large tuning range of the oscillator is desired, the first coupling capacitor C1 can also be connected in series with a further capacity diode which is then introduced advantageously between the coupling capacitor C1 and the first capacitor C' of the capacitive voltage divider C', C*.

It is advisable to combine, largely monolithically, the circuit of the oscillator, according to the invention shown in FIG. 3, so that with the exception of the d-c voltage sources, and the capacities and inductances having too high a value for integration, the circuit parts shown in FIG. 1 and also in FIG. 2 are united or integrated in one chip.

The following data, for example, are suitable for the circuit:

Coupling capacitor C1=3.3 pF, coupling capacitor C2=100 pF; emitter series resistor R1=300 ohms, capacitor C3=20 pF; resistor R2=R3=3 kilo-ohms; load resistors R4=R5=400 ohms; U1=7 to 8 volts; U3=2.8 volts; U*: in the range of 0 to 28 volts; resistance R*=about 47 kilo-ohms. The use of a respective commercially available capacity diode of the type BB609 is recommended for the capacitors C' and C*, particularly if the circuit is used for cable television. Otherwise, it will not be difficult for an expert skilled in the art to determine the values indicated for a given use range for the capacities C' and C*.

As was indicated hereinbefore, the coupling capacitor C2 which leads to the collector of the second transistor i.e. the transistor T2, of the differential amplifier can be replaced by an oscillating crystal, so that, in this manner, the circuit for a crystal-controlled oscillator according to the invention can be somewhat simplified. Thus, also the direct connection between the two coupling capacitors C1 and C2 which is present in the other above-described case of the circuit, wherein an oscillating crystal control is used, is inapplicable. This leads to a so-called overtone oscillator.

The advantages and possibilities of an oscillator according to the invention come to bear particularly if the oscillator according to FIG. 4 is supplemented by a following mixer stage to form an input stage of a superheterodyne receiver.

The mixer stage shown in FIG. 4 is formed of two transistor pairs T3 and T4 as well as T5 and T6, respectively, of which the individual transistors are of the same type as the transistors T1 and T2 of the oscillator. The symmetrical mixer stage is realized due to the fact that the npn transistors T3 and T4, on the one hand, and the npn transistors T5 and T6, on the other hand, are connected in pairs together via the emitters thereof, and the collector of a respective transistor of the two pairs is connected to the one output terminal A1, and the collector of a respective one of the two other transistors of the two pairs is connected to the other output terminal A2. In the case of the illustrated embodiment of FIG. 4, the collector of the transistor T3 and the collector of the transistor T5 are connected to the terminal A1, and the collector of the transistor T4 and the collector of the transistor T6 are connected to the terminal A2 of the output of the mixer stage.

On the other hand, the transistors T3 and T6 as well as the transistors T5 and T4 are combined into respective transistor pairs via the base terminals thereof, by controlling the two transistors T3 and T6 jointly from the collector of the first oscillator transistor T1, as well as the two transistors T4 and T5 jointly from the collector of the second oscillator transistor T2 via the base terminals thereof.

Furthermore, the emitters of the transistors T3 and T4 are connected to the collector of another npn transistor T7, as well as the emitters of the transistors T5 and T6 to the collector of a sixth npn transistor of the mixer stage i.e. the transistor T8. The emitters of the two last-mentioned npn transistors T7 and T8 are connected via a common emitter series resistor to the reference potential i.e. to the above-defined supply terminal for the reference potential. The emitter series resistor of T7 and T8 is the resistor R4.

A fourth d-c voltage source U2 is connected by the negative pole thereof to the aforementioned supply terminal for the reference potential, and by the positive pole thereof, via a respective resistor R5 and R6, to the base of the transistor T7 and the transistor T8. In addition, the base terminals of the two transistors T7 and T8 form a respective terminal E1, E2 which can be acted upon, for example, jointly by a signal which is to be processed externally and is supplied, for example, via a non-illustrated pre-amplifier, the respective terminal E1 and E2 being, in other words, the signal input of the mixer stage.

According to the teachings of the invention, each of the two output terminals A*, A2* of the oscillator i.e. the collector of the oscillator transistor T1 and T2, is connected via a resistor R9 and R10, respectively, to a respective input of a control amplifier V. In addition, the two resistors R9 and R10 are connected to each other via a capacitor C4 at the terminal facing away from the transistor T1 and T2, respectively.

Thus, the resistor R9 and the resistor R10 form with the capacitor C4 a low-pass filter by which the control amplifier V is controlled. The signal output of the control amplifier V is connected directly to the base of the second oscillator transistor T2. The low-pass filter R9, R10, C4 is constructed so that the occurence of oscillator oscillations at the input of the control amplifier V is completely suppressed. This leads to the situation that the negative feedback leading through the control amplifier V is purely d-c-wise. As a result, the asymmetry of the variations in potential at the two output terminals A1*, A2* of the oscillator, which is unavoidable, in principle, is reduced. This has the effect of suppressing oscillator noise as well as of compensating or cancelling further disturbances stemming from the oscillator on the IF signal supplied by the output A1, A2 of the mixer stage.

It will then be understood that the improvement achieved by the further embodiment of the invention with respect to the operation of the oscillator must also have an effect, in a favorable sense, upon the signal produced at the output of the mixer stage.

If one should wish to improve the circuit shown in FIG. 2 in line with the further embodiment of the invention, the capacitor C provided thereat in the tuned circuit 25 could be realized as a voltage divider of two series-connected capacitors C', C* and they could be connected together with a further d-c voltage source corresponding to the d-c voltage source U* and a resistor corresponding to the resistor R*, in the same sense as in the FIGS. 1 and 2 of the instant application, to the capacitor 28 corresponding to the first capacitor C1 as well as to the capacitor 29 corresponding to the second coupling capacitor C2. In conclusion, it can further be said with regard to the transistor oscillator circuit according to the further embodiment of the invention that, instead of npn transistors, pnp transistors can also be used in principle, because then also the effect sought by the invention is also achieved. Realization in MOS technology is also possible, especially since suitable possibilities for realizing resistors and capacitors are then available, and differential amplifiers with source-coupled MOS transistors, especially of the enhancement type, are likewise within the state of the art.

There are claimed:

1. Integrable oscillator circuit having a mixing stage driven by an external signal and an oscillating stage formed by a differential amplifier having a first and a second emitter-coupled transistor, both of the transistors being connected by the emitters thereof to a reference potential supplied by a d-c voltage source and by the collectors thereof via a respective resistor to a supply potential supplied by the d-c voltage source, the base terminal of the first transistor of the differential amplifier being controlled by a frequency-determining control member, and the base terminal of the second transistor of the differential amplifier being connected to the reference potential via a capacitor, the collector of the second transistor forming a signal output delivering an electric oscillation generated in the oscillating stage, and including a feedback connection between the collector of the second transistor and the base of the first transistor, the feed-back connection being via the frequency-determining control member, comprising a control amplifier having a plurality of inputs, the respective collector of the first and second transistors being connected to respective input terminals of the mixing stage as well as via a respective lowpass filter to the inputs, respectively, of said control amplifier, said control amplifier having an output fed back to the oscillating stage in the sense of a d-c-wise negative feedback connection so that the collector potentials of said first and second transistor as well as the potential at said input terminals of the mixing stage operate with minimal offset.

2. Circuit according to claim 1, wherein the base of the first transistor as well as the base of the second transistor are connected via a respective resistor to a first pole of a further d-c voltage source having a second pole connected to the reference potential; said feedback connection between the collector of the second transistor and the base of the first transistor comprising a series circuit of two capacitors, one of said capacitors being connected directly to the collector of the second transistor and the other of said capacitors being connected directly to the base of the first transistor, the control of the base terminal of the first transistor by the frequency-determining control member being exclusively via said other capacitor connected thereto; the respective collector of the first and the second transistor being connected via a respective circuit section acting as said lowpass filter to a respective input of said control amplifier, said output of said control amplifier being connected to the base of the second transistor.

3. Circuit according to claim 1 wherein the mixing stage is symmetrical and is formed of identical transistors; the mixing stage having inputs driven by the first and second transistors of the oscillating stage and connected to the base of a respective third and fourth transistor, said mixing-stage inputs being connected via a resistor to one pole of another d-c voltage source, said other d-c voltage source having another pole tied to the reference potential; said third and fourth transistors having respective emitters connected via a common resistor to the reference potential, and having respective collectors connected to emitters of a respective further pair of fifth and sixth as well as seventh and eighth transistors, each of said fifth and sixth transistors being connected via the respective base thereof to a respective one of said seventh and eighth transistors via the respective base of said seventh and eighth transistors, the respective one of said fifth and sixth transistors being combined via the respective collector thereof with the collector of the respective other transistor of said seventh and eighth transistor pair and forming thereby a respective signal output of the mixing stage, the base of said seventh and eighth transistors being connected to the collector of the respective first and second transistor forming the oscillating stage to the signal input of the mixing stage.

4. Circuit according to claim 3, wherein said collectors of said fifth and sixth as well as said seventh and eighth transistor pairs are connected via an emitter-collector path of a respective ninth and tenth transistor to a corresponding terminal of said signal output of the mixing stage, and the base terminals of said ninth and tenth transistors being connected via a common resistor to a pole of the voltage source facing away from the reference potential of the voltage source furnishing the supply potential for the differential amplifiers forming the oscillating stage.

5. Circuit according to claim 3, wherein said one pole faces away from the reference potential of the voltage source furnishing the reference potential and the supply potential for the differential amplifiers forming the oscillating stage and is connected to the collector of two additional transistors having base terminals driven by the collector of the respective first and second transistors forming the oscillating state; said two additional transistors having respective emitters operated in an emitter circuit for controlling respective ones of the two inputs of the mixing stage to be driven from the oscillating stage.

6. Circuit according to claim 1, wherein the frequency-determining control member of the oscillating stage includes another capacitor connected by one terminal thereof to a first coupling capacitor leading to the first transistor of the differential amplifier and by the other terminal thereof directly to a second coupling capacitor leading to the collector of the second transistor of the differential amplifier, the frequency-determining control member having a further capacitor connected by one terminal thereof directly to the terminal of the second coupling capacitor facing away from the second transistor of the differential amplifier as well as, via a resistor, to one pole of another d-c voltage source, another terminal of the further capacitor and the other pole of said other d-c voltage source being connected directly to the supply terminal carrying the reference potential of the oscillating stage.

7. Integrable oscillator circuit having a mixing stage driven by an external signal, and an oscillating stage formed by a differential amplifier having a first and a second emitter-coupled transistor, both of the transistors being connected by the emitters thereof to a reference potential supplied by a d-c voltage source and by the collectors thereof, via a respective resistor, to a supply potential supplied by the d-c voltage source, the base terminal of the first transistor of the differential amplifier being controlled by a frequency-determining control member, and the base terminal of the second transistor of the differential amplifier being connected to the reference potential via a capacitor, the collector of the second transistor forming a signal output delivering an electric oscillation generated in the oscillating stage, and including a feedback connection between the collector of the second transistor and the base of the first transistor, comprising a control amplifier having a plurality of inputs, a respective resistor connected intermediate to the base of the first transistor as well as the base of the second transistor and a first pole of a further d-c voltage source having a second pole connected to the reference potential; the feedback connection between the collector of the second transistor and the base of the first transistor comprising a series circuit of two capacitors and said frequency-determining control member, one of said capacitors being connected directly to the collector of the second transistor, and the other of said capacitors being connected directly to the base of the first transistor; the base terminal of the first transistor being controllable by the frequency-determining control member exclusively via said other capacitor connected thereto; the respective collector of the first and the second transisor being connected to respective inputs of the mixing stage and via a respective circuit section acting as a lowpass filter to a respective input of said control amplifier, said control amplifier having an output connected to the base of the second transistor.

8. Circuit according to claim 7 wherein the mixing stage is symmetrical and is formed of identical transistors; the mixing stage having inputs driven by one of the first and second transistors of the oscillating stage and connected to the base of a respective third and fourth transistor and connected via a resistor to one pole of another d-c voltage source having another pole tied to the reference potential; said third and fourth transistors having respective emitters connected via a common resistor to the reference potential, and having respective collectors connected to emitters of a respective further pair of fifth and sixth as well as seventh and eight transistors, each of said fifth and sixth transistors being connected via the respective base thereof to a respective one of said seventh and eighth transistors via the respective base of said seventh and eighth transistors, the respective one of said fifth and sixth transistors being combined via the respective collector thereof with the collector of the respective other transistor of said seventh and eighth transistor pair and forming thereby a respective signal output of the mixing stage, the base of said seventh and eighth transistors being connected to the collector of the respective first and second transistors forming the oscillating stage to the signal input of the mixing stage.

9. Circuit according to claim 8 wherein said collectors of said fifth and sixth as well as said seventh and eighth transistor pairs are connected via an emitter-collector path of a respective ninth and tenth transistor to a corresponding terminal of said signal output of the mixing stage, and the base terminals of said ninth and tenth transistors being connected via a common resistor to a pole of the voltage source facing away from the reference potential of the voltage source furnishing the supply potential for the differential amplifiers forming the oscillating stage.

10. Circuit according to claim 8, wherein said pole facing away from the reference potential of the voltage source furnishing the reference potential and the supply potential for the differential amplifiers forming the oscillating stage, is connected to the collector of eleventh and twelfth transistors having base terminals driven by the collector of the respective first and second transistors forming the oscillating stage; said eleventh and twelfth transistors having respective emitters operated in an emitter circuit for controlling respective ones of the two inputs of the mixing stage to be driven from the oscillating stage.

11. Circuit according to claim 7, wherein the frequency determining control member of the oscillating stage includes a capacitor connected by one terminal thereof to a first coupling capacitor leading to the first transistor of the differential amplifier and by the other terminal thereof directly to a second coupling capacitor leading to the collector of the second transistor of the differential amplifier, the frequency-determining control member having a further capacitor connected by one terminal thereof directly to the terminal of the second coupling capacitor facing away from the second transistor of the differential amplifier as well as, via a resistor, to one pole of another d-c voltage source, another terminal of the further capacitor and the other pole of said other d-c voltage source being connected directly to the supply terminal carrying the reference potential of the oscillating stage.

* * * * *